US006359303B1

(12) United States Patent
Kanamori

(10) Patent No.: US 6,359,303 B1
(45) Date of Patent: Mar. 19, 2002

(54) SPLIT GATE FLASH MEMORY WITH VIRTUAL GROUND ARRAY STRUCTURE AND METHOD OF FABRICATING THE SAME

(75) Inventor: Kohji Kanamori, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/414,605

(22) Filed: Oct. 8, 1999

(30) Foreign Application Priority Data

Oct. 8, 1998 (JP) .......................................... 10-286769

(51) Int. Cl.$^7$ .............................................. H01L 29/76
(52) U.S. Cl. ...................... 257/314; 257/315; 257/316; 257/317; 257/321; 257/322
(58) Field of Search ................................. 257/314–317, 257/321–322

(56) References Cited

U.S. PATENT DOCUMENTS 5,042,009 A * 8/1991 Kazerounian et al. ...... 365/185

FOREIGN PATENT DOCUMENTS

KR        A-1999-064119      * 10/1998

* cited by examiner

*Primary Examiner*—Sara Crane
*Assistant Examiner*—Thien F Tran
(74) *Attorney, Agent, or Firm*—Young & Thompson

(57) ABSTRACT

The present invention provides a flash memory having a split gate structure and a virtual array structure, wherein a high impurity concentration region of a first conductivity type is provided in a drain adjacent region of a channel region under a floating gate electrode, and the high impurity concentration region has a highest impurity concentration in the channel region, and wherein a low impurity concentration region of a first conductivity type is provided in the channel region but at a part not covered by the floating gate.

4 Claims, 26 Drawing Sheets

SPLIT GATE FLASH MEMORY WITH VIRTUAL GROUND ARRAY STRUCTURE AND METHOD OF FABRICATING THE SAME

BACKGROUND OF THE INVENTION

The present invention relates to a non-volatile semiconductor memory device, and more particularly to a split gate flash memory with a virtual ground array, wherein impurity diffusion layers are used as bit lines, and a method of fabricating the same.

In Japanese laid-open patent publication No. 2-292870, one conventional structure of the split gate flash memory is disclosed, which will be described in detail with reference to FIGS. 1A and 1B. FIG. 1A is a fragmentary plane view illustrative of a first conventional split gate flash memory with the virtual ground array. FIG. 1B is a fragmentary cross sectional elevation view illustrative of a first conventional split gate flash memory with the virtual ground array taken along an A–A' line of FIG. 1A.

Field oxide layers 125 are provided on a surface of a semiconductor substrate 111 so that the field oxide layers 125 extend in parallel to each other and to a first direction. Under the field oxide films 125, n-type impurity diffusion layers 123d and 123s are provided commonly to a plurality of memory cells so that the n-type impurity diffusion layers 123d and 123s are buried diffusion layers are used for bit lines and source lines. The buried diffusion layer 123d forms a drain region. The buried diffusion layer 123s forms a source region. A channel region is defined between the buried diffusion layer 123d as the drain region and the buried diffusion layer 123s as the source region. A gate insulation film is provided, which extends over a half region of the channel region closer to the drain region. A floating gate 115 is provided with extends on the gate insulation film so that the floating gate 115 is positioned over the half region of the channel region and over a part of the field oxide film 125. An insulation film is provided which extends over a source side half region 114 of the channel region and over the floating gate 115. A control gate 129 is provided which extends on the insulation film so that the control gate 129 is positioned over the floating gate electrode 115 and the source side half region 114. The control gate electrode 129 is stripe-shaped. The control gate electrode 129 is used as a word line. Data writing operation is made by injection of hot electrons into the floating gate electrode 115. Data erasing operation is made by drawing electrons from the floating gate electrode 115 by F-N tunnel current from the floating gate electrode 115 to an erasing gate electrode 141.

In the above structure, boron doped high impurity regions 127 are provided under a half of the drain region 123d and a half of the source region 123c, so that edges of the boron doped high impurity regions 127 are adjacent to the bottoms of the gate insulation film under the floating gate electrode 115. The boron doped high impurity regions 127 causes a source-drain electric field concentration in the boron doped high impurity regions 127 in order to increase the efficiency of hot electron injection.

FIGS. 2A through 2E are fragmentary cross sectional elevation views illustrative of sequential steps of fabricating the conventional flash memory shown in FIGS. 1A and 1B.

With reference to FIG. 2A, a nitride layer 151 and a photo-resist mask 166 are formed over a surface of a semiconductor substrate 111 before boron is ion-implanted through stripe-shaped openings 154 into surface regions of the semiconductor substrate 111 so as to form p+-type regions 161.

With reference to FIG. 2B, after the photo-resist mask 166 has been removed, the nitride layer 151 is used as a mask for carrying out an ion-implantation of arsenic through stripe-shaped openings 153 to form n+-type regions 157.

With reference to FIG. 2C, field oxide films 125 are formed in the openings 153, whereby concurrently diffusions and activation of impurities in the p+-type regions 161 and the n+-type regions 157 are caused thereby to form buried diffusion layers 123 as the n-type source and drain regions and p+-type diffusion regions 127. After the nitride layer 151 is removed, then a surface of the substrate is subjected to an oxidation to form a gate oxide film 117.

With reference to FIG. 2D, a polysilicon film is entirely deposited for subsequent patterning the polysilicon film to form a floating gate 115 before an inter-layer insulator is then formed.

With reference to FIG. 2E, a polysilicon film is entirely deposited for subsequent patterning the polysilicon film to form a control gate 129 and then further an erasing gate not illustrated is formed to complete the flash memory.

In accordance with the above structure of the flash memory, if a degree of integration of the memory is low, then the p+-type region 127 is formed only under the floating gate side of the buried diffusion layer, thereby allowing an efficient hot electron injection. However, if the integration degree is increased and a scaling down of individual elements of the memory is required, then the width of the buried diffusion layers 123d and 123s is made narrower. Further, boron of the p+-type diffusion region 127 is likely to be diffused as compared to arsenic. For those reasons, p+-type diffusion regions may be formed under the other half side of the buried diffusion layers 123d and 123s. This problem is easily caused by a slight variation in alignment under the scaled down condition. FIG. 3 is a fragmentary cross sectional elevation view illustrative of the flash memory structure, where the p+-type diffusion layers are extensively diffused.

It is further required to use different masks for the boron ion-implantation and the arsenic ion-implantation whereby the number of the necessary steps are increased.

FIGS. 4A through 4G are fragmentary cross sectional elevation views illustrative of another conventional method of fabricating a flash memory which is suitable for scaling down requirement.

With reference to FIG. 4A, field oxide regions not illustrated are formed on a p-type silicon substrate 21 before a silicon oxide layer 22 having a thickness of 300 nanometers is formed by a chemical vapor deposition method.

With reference to FIG. 4B, a photo-lithography method and a subsequent dry etching method are used to form stripe-shaped openings 23 in the silicon oxide layer 22.

With reference to FIG. 4C, a silicon oxide film is deposited by a chemical vapor deposition for subsequent etch-back process to form side wall oxide films 24 on vertical walls of the stripe-shaped openings 23. The silicon oxide layer 22 and the side wall oxide films 24 are used as a mask to carry out an ion-implantation of arsenic at an acceleration energy of 40 keV and a dose of 4E15 cm$^{-2}$. The side wall oxide films 24 allow further size down the wide of the stripe-shaped openings beyond the limitation of the photo-lithography technique.

With reference to FIG. 4D, an anneal is carried out in a nitrogen atmosphere at a temperature of 950° C. for 20 minutes for activation of the arsenic ions to form impurity diffusion layers 28s and 28d. Those impurity diffusion layers serve as bit line and source line which are common to a plurality of memory cells. Thereafter, the silicon oxide film 22 and he side wall oxide films 24 are removed, and then a gate oxide film 26 is formed.

With reference to FIG. 4E, a photo-resist not illustrated and having openings only memory cell regions is formed before an ion-implantation of boron is carried out at an acceleration energy of 50 keV and a dose of 3E13 cm$^{-2}$.

With reference to FIG. 4F, a polysilicon is deposited and then the polysilicon is patterned to form floating gates 30. Those floating gates 30 are used as masks for carrying out an ion-implantation of arsenic at an acceleration energy of 100 keV and a dose of 4E13 cm$^{-2}$.

With reference to FIG. 4G, a polysilicon film is deposited before patterning the same to form a control gate 32. Further, an erasing gate not illustrated is formed to complete the another conventional flash memory.

Boron ion-implantation was carried out to increase a surface resistance of the channel region. Further, arsenic ion-implantation into the portions not covered by the floating gates causes drop in resistance of the channel half region closer to the source side 28s, so that the resistance of the channel region only under the floating gate is increased to cause a field concentration at this region for causing an efficient hot electron injection under the floating gate. The above ion-implantation is carried out by using the floating gates as masks in self-alignment technique. This method is suitable for scaling down the memory device.

Actually, however, the hot electron injection appears only at a drain side region closer to the drain region in the channel region under the floating gate electrode, for which reason even if the resistance of the entire channel region under the floating gate is increased, the efficiency of data writing operation through the hot electron injection is not so increased. The channel resistance is increased and a read out current is decreased, whereby it is difficult to keep a sufficient margin between the data writing state and the data erasing state.

Further, if the read out current is decreased, this means that it takes may time to discharge pre-charged bit line whereby the reading speed is reduced. Furthermore, a difference in read out current between a memory cell storing "1" and a memory cell storing "0" is made small, whereby in the memory device storing multiple values, an allowable range in reading out current responsive to individual value is made narrower, whereby an erroneous reading our operation and a leakage of charge accumulated in the floating gate may be caused, resulting in reduction in reliability of the memory device.

In addition, in a region having a transistor for selecting memory cells, a high resistance of the channel region is not preferable, for which reason it is necessary to form a photo-resist film serving as a mask for preventing ion-implantation into other regions than the memory cells, for example, peripheral circuit regions. The fabrication processes are thus complicated.

In the above circumstances, it had been required to develop a novel flash memory free from the above problem.

SUMMARY OF THE INVENTION

Accordingly, it is an object of the present invention to provide a novel flash memory free from the above problems.

It is a further object of the present invention to provide a novel flash memory suitable for scaling down the same.

It is a still further object of the present invention to provide a novel flash memory suitable for high integration.

It is yet a further object of the present invention to provide a novel flash memory capable of highly efficient data writing operation.

It is further more object of the present invention to provide a novel flash memory superior in read out current characteristic.

It is moreover object of the present invention to provide a novel method of forming a flash memory with reduced number of photo-resist processes.

It is an additional object of the present invention to provide a novel method of forming a flash memory with a high productivity.

The present invention provides a flash memory having a split gate structure and a virtual ground array structure, wherein a high impurity concentration region of a first conductivity type is provided in a drain adjacent region of a channel region under a floating gate electrode, and the high impurity concentration region has a highest impurity concentration in the channel region, and wherein a low impurity concentration region of a first conductivity type is provided in the channel region but at a part not covered by the floating gate.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
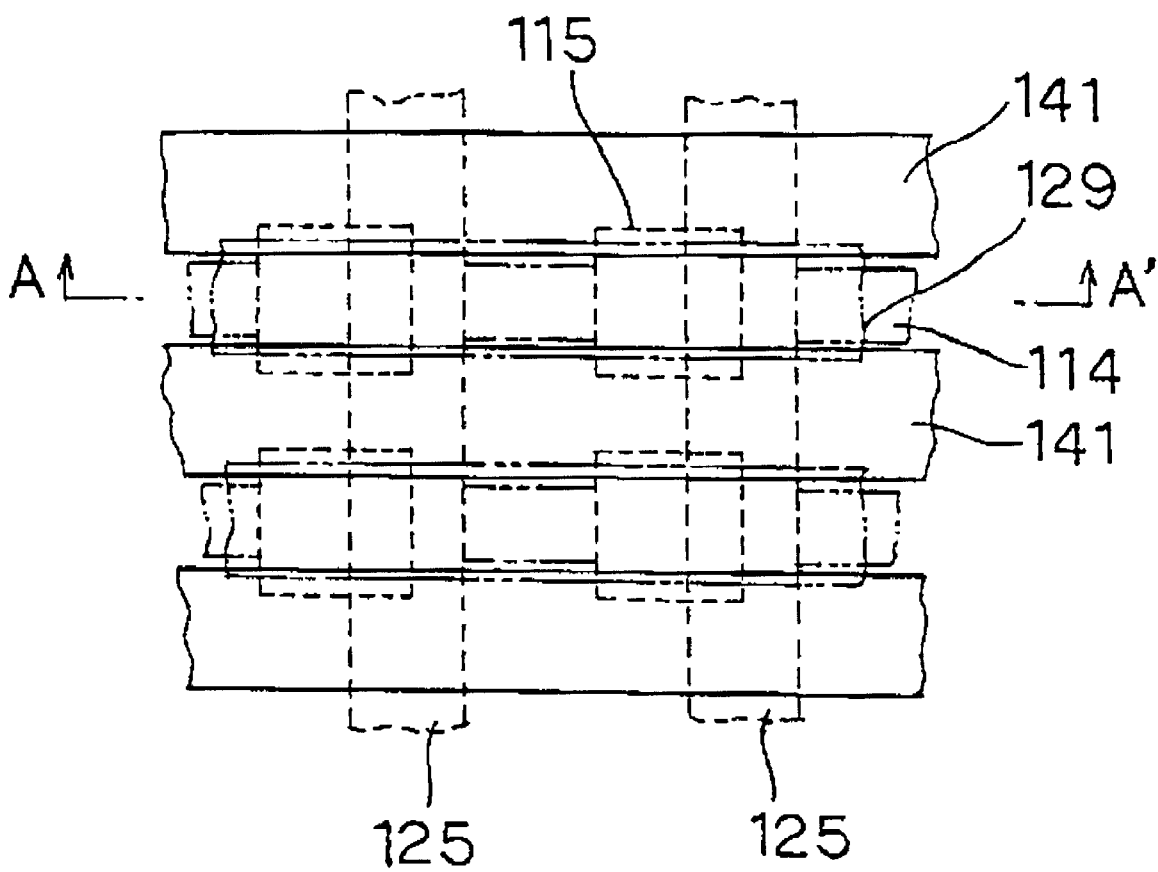
FIG. 1A is a fragmentary plane view illustrative of a first conventional split gate flash memory with the virtual ground array.
Figure 1B:
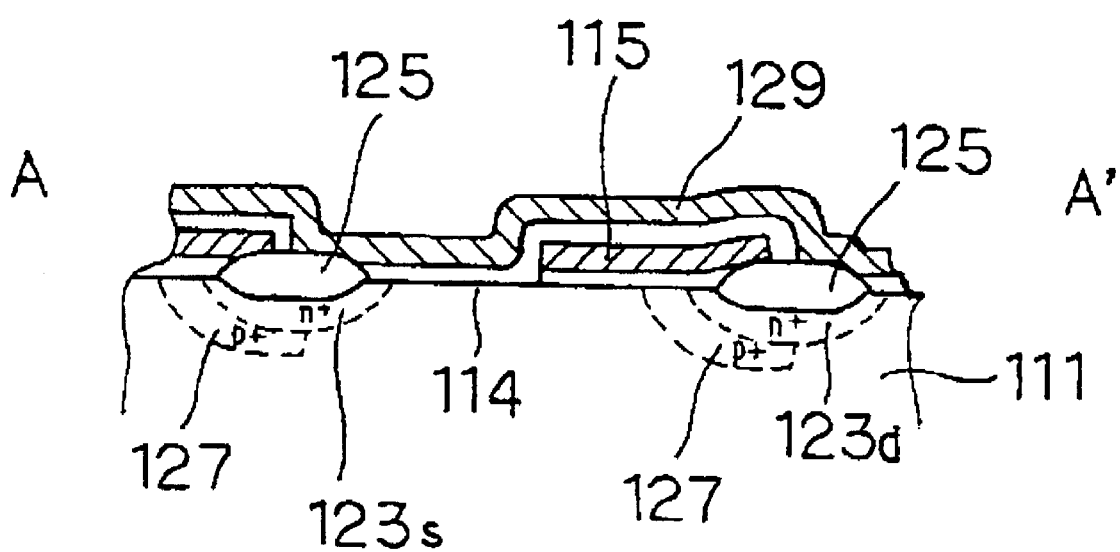
FIG. 1B is a fragmentary cross sectional elevation view illustrative of a first conventional split gate flash memory with the virtual ground array taken along an A–A' line of FIG. 1A.
Figure 2A:
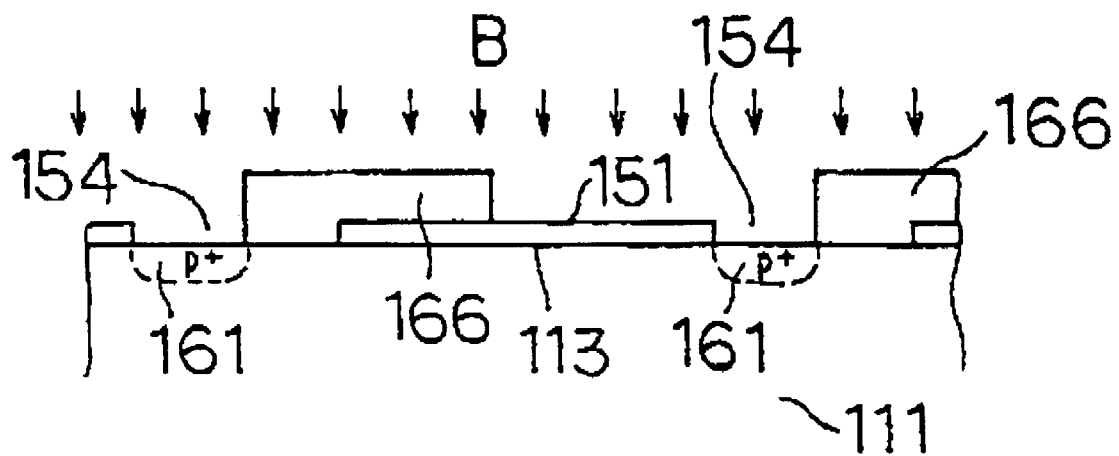
FIGS. 2A through 2E are fragmentary cross sectional elevation views illustrative of sequential steps of fabricating the conventional flash memory shown in FIGS. 1A and 1B.
Figure 2B:
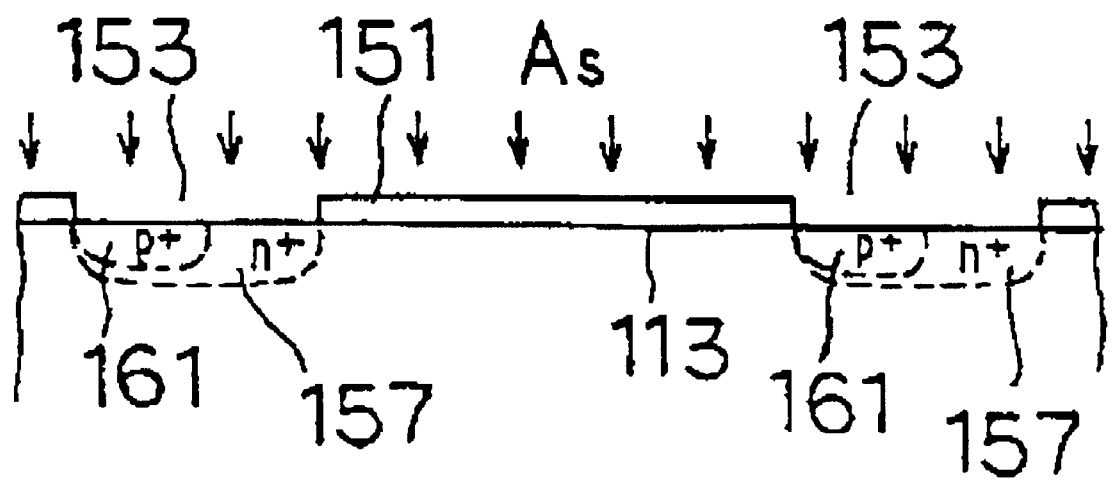
Figure 2C:
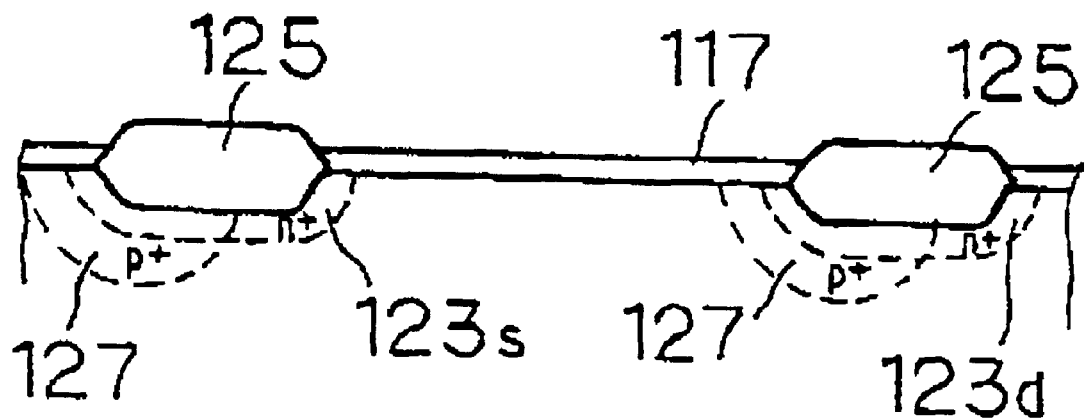
Figure 2D:
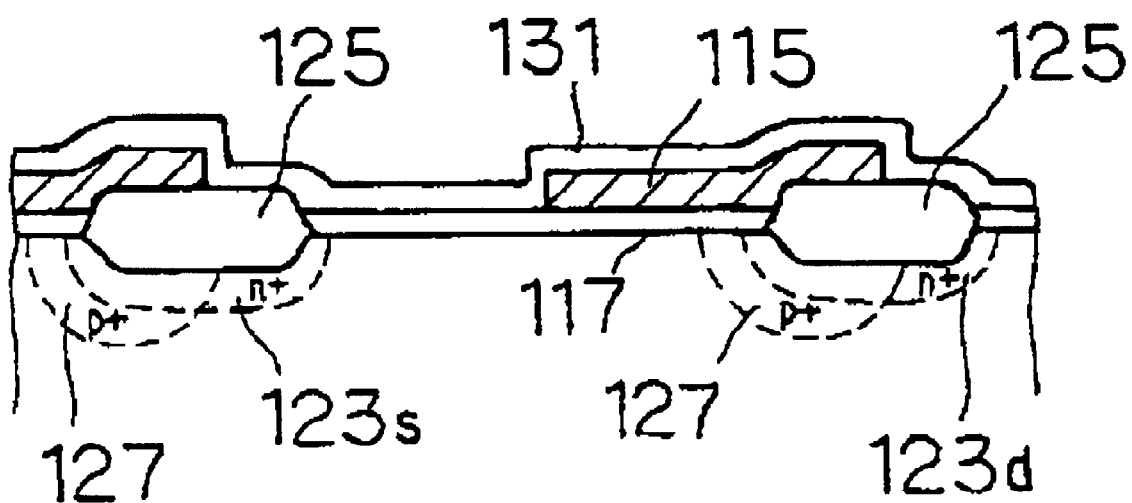
Figure 2E:
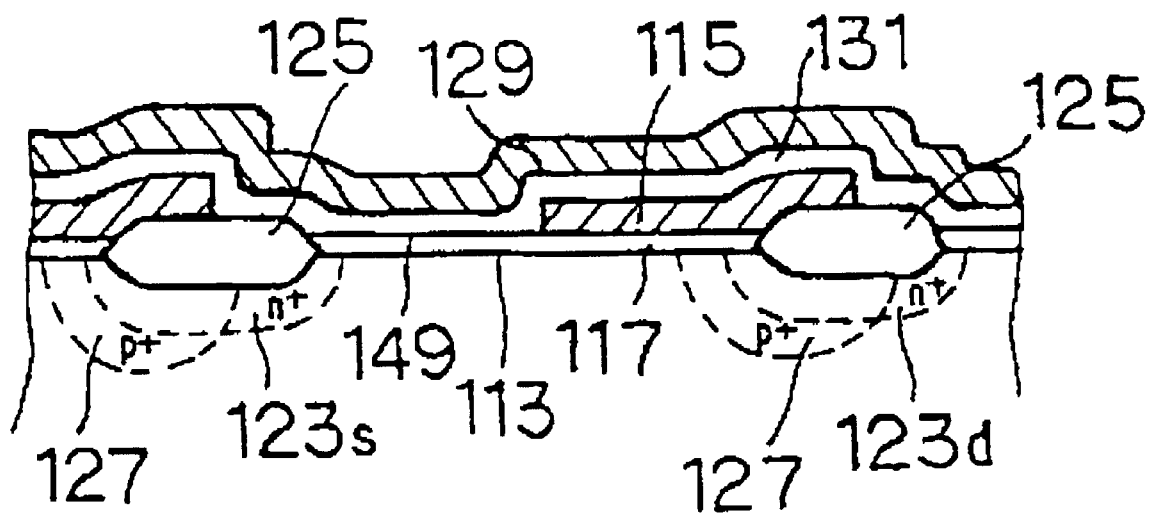
Figure 3:
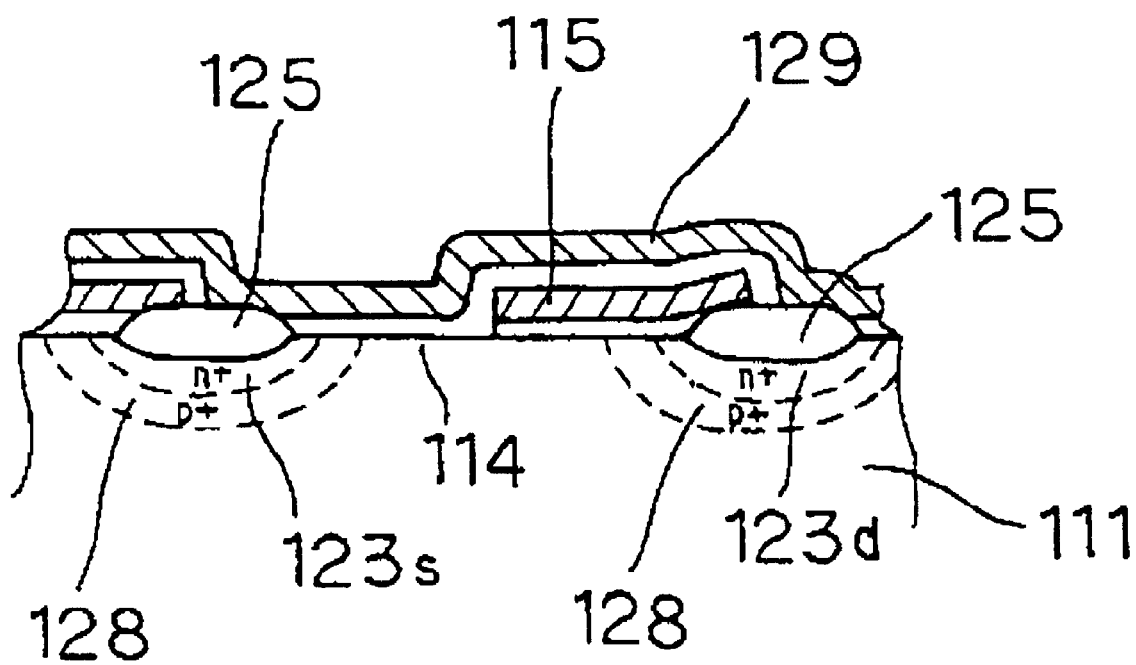
FIG. 3 is a fragmentary cross sectional elevation view illustrative of the flash memory structure, where the p+-type diffusion layers are extensively diffused in FIG. 1B.
Figure 4A:
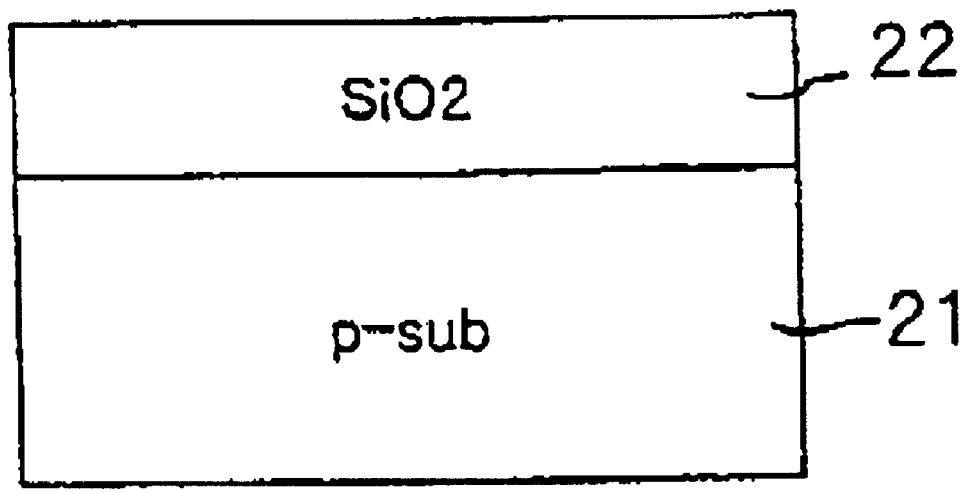
FIGS. 4A through 4G are fragmentary cross sectional elevation views illustrative of another conventional method of fabricating a flash memory which is suitable for scaling down requirement.
Figure 4B:
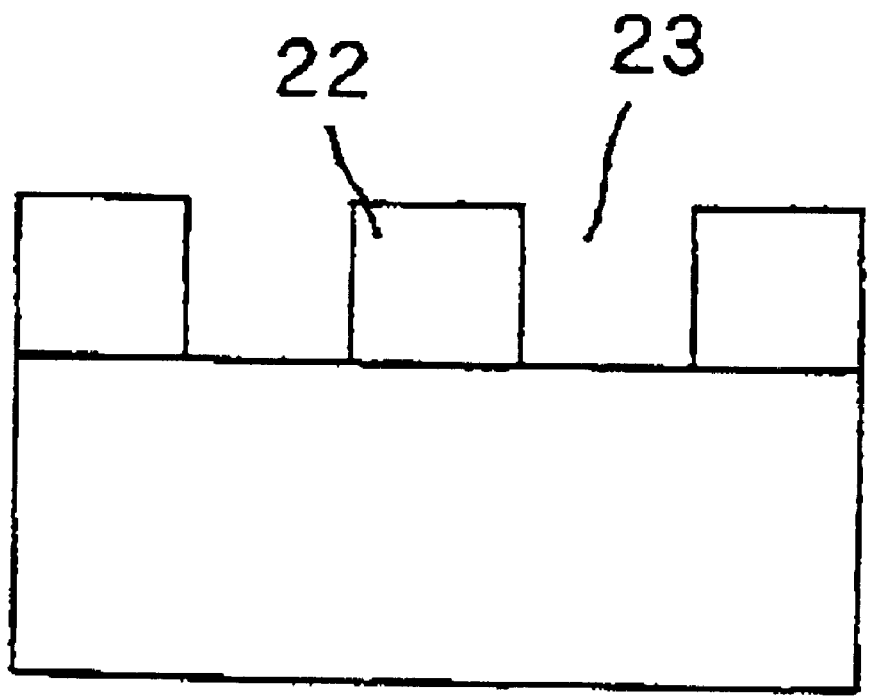
Figure 4C:
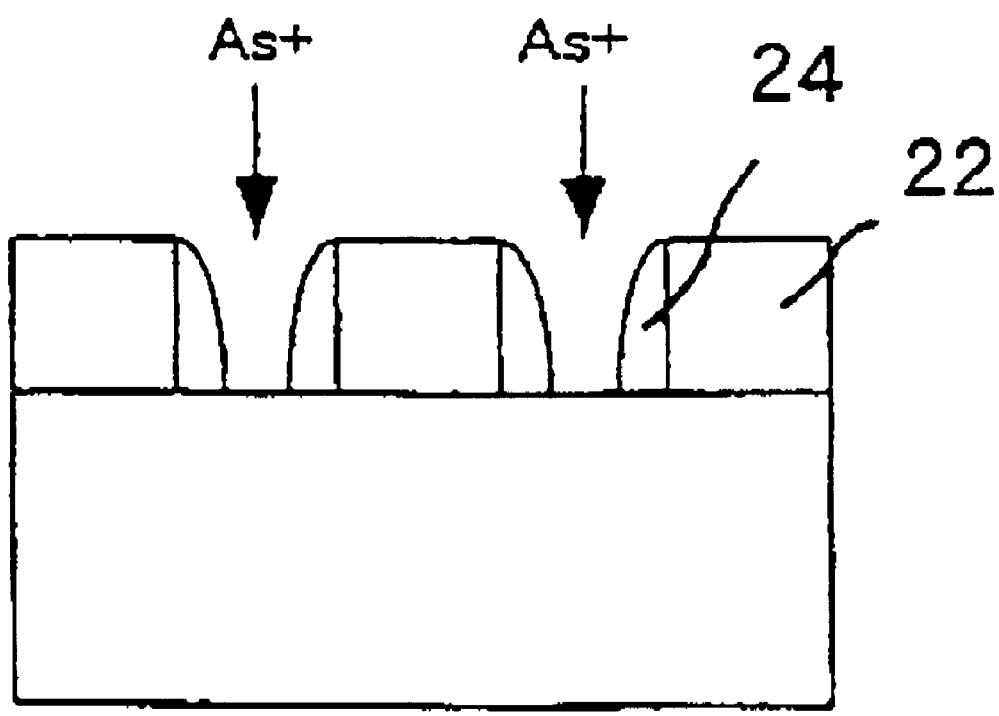
Figure 4D:
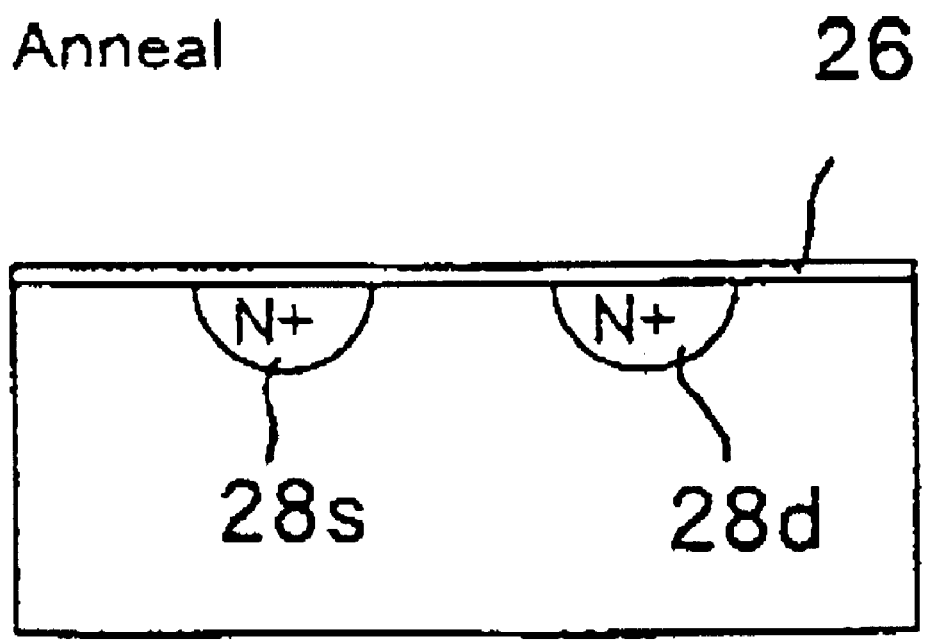
Figure 4E:
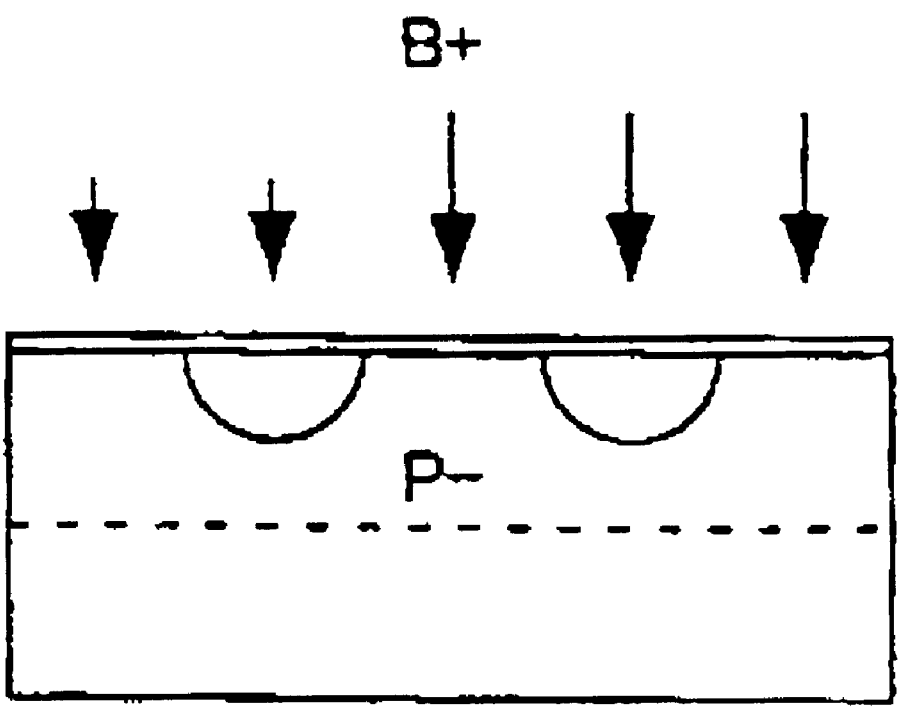
Figure 4F:
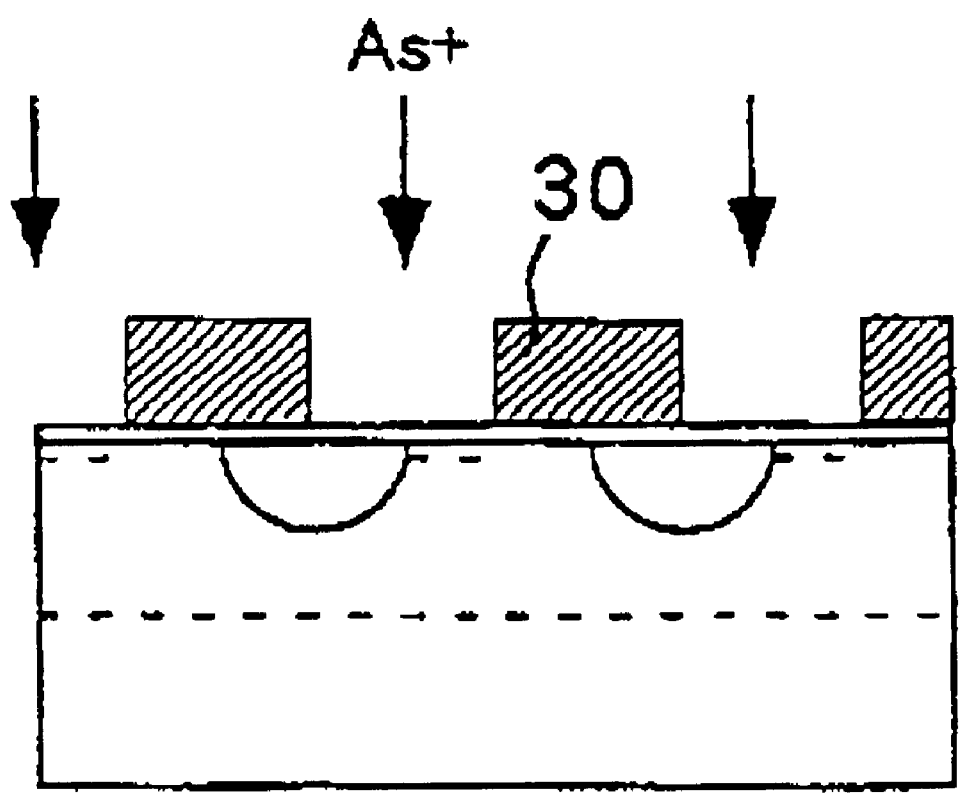
Figure 4G:
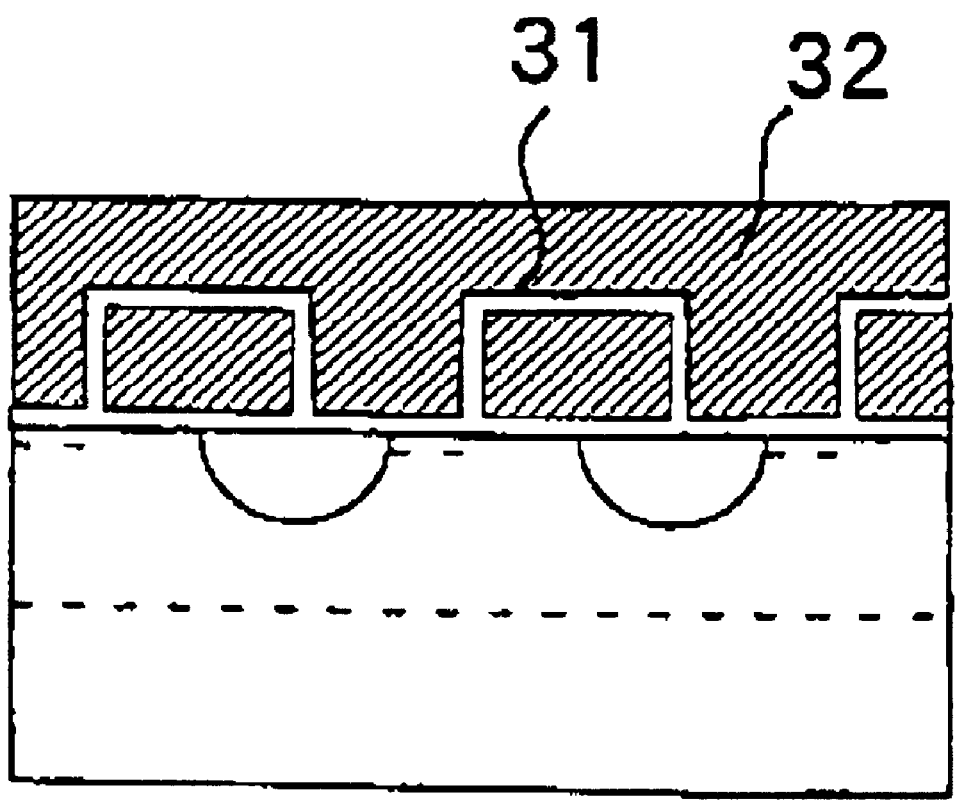

The present invention provides a flash memory having a split gate structure and a virtual ground array structure, wherein a high impurity concentration region of a first conductivity type is provided in a drain adjacent region of a channel region under a floating gate electrode, and the high impurity concentration region has a highest impurity concentration in the channel region, and wherein a low impurity concentration region of a first conductivity type is provided in the channel region but at a part not covered by the floating gate.

It is preferable that the channel region under the floating gate has a first conductivity type impurity concentration profile that the concentration is simply decreased from the highest impurity concentration toward a source side.

It is also preferable that the high impurity concentration region surrounds a second conductivity type impurity diffusion layer to separate the second conductivity type impurity diffusion layer from a substrate, except for a region in which the low impurity concentration region is formed.

It is also preferable that a field intensity has a sharp-pointed peak adjacent to he drain region.

The present invention provides a method of forming a flash memory having a split gate structure and a virtual ground array structure. The method comprises the steps of: carrying out a first ion-implantation of a first conductivity type impurity by use of a first mask having a first stripe-shaped opening with a center corresponding to a center line of a region for formation of impurity diffusion layer for bit line or source line; carrying out a second ion-implantation of a second conductivity type impurity by use of a second mask having a second stripe-shaped opening with a center corresponding to the center line and the second opening being narrower than the first opening; forming a floating gate; and carrying out a third ion-implantation of a second conductivity type impurity by use of the floating gate as a mask.

It is preferable that the second mask comprises the first mask and side wall oxide films on side walls of the first mask.

The third present invention provides a method of forming a flash memory comprising the steps of: forming a silicon oxide film having a first stripe-shaped opening with a center corresponding to a center line of a region for formation of an impurity diffusion layer for bit line or source line; carrying out a first ion-implantation process of a first conductivity type impurity into a semiconductor substrate surface by use of the silicon oxide film as a mask; forming side wall oxide films on side walls of the silicon oxide film; carrying out a second ion-implantation process of a second conductivity type impurity into the semiconductor substrate surface by use of the silicon oxide film and the side wall oxide films as a mask; carrying out an anneal to form a second conductivity type diffusion region and a first conductivity type diffusion region surrounding the second conductivity type diffusion region; forming a floating gate; carrying out a third ion-implantation of a second conductivity type impurity by use of the floating gate as a mask.

PREFERRED EMBODIMENT

Figure 5:
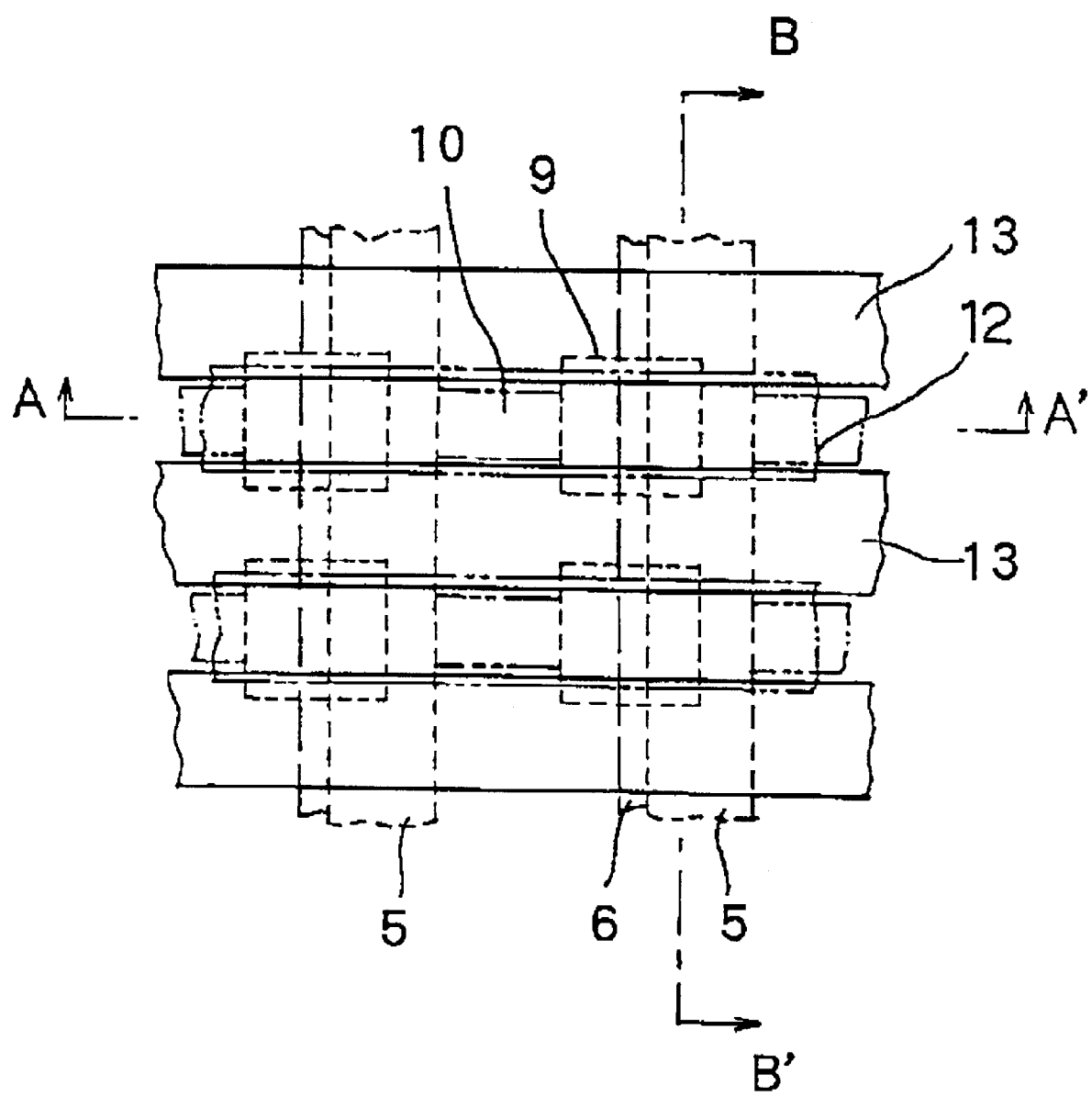
FIG. 5 is a fragmentary plane view illustrative of a novel flash memory of a first embodiment in accordance with the present invention.
Figure 6:
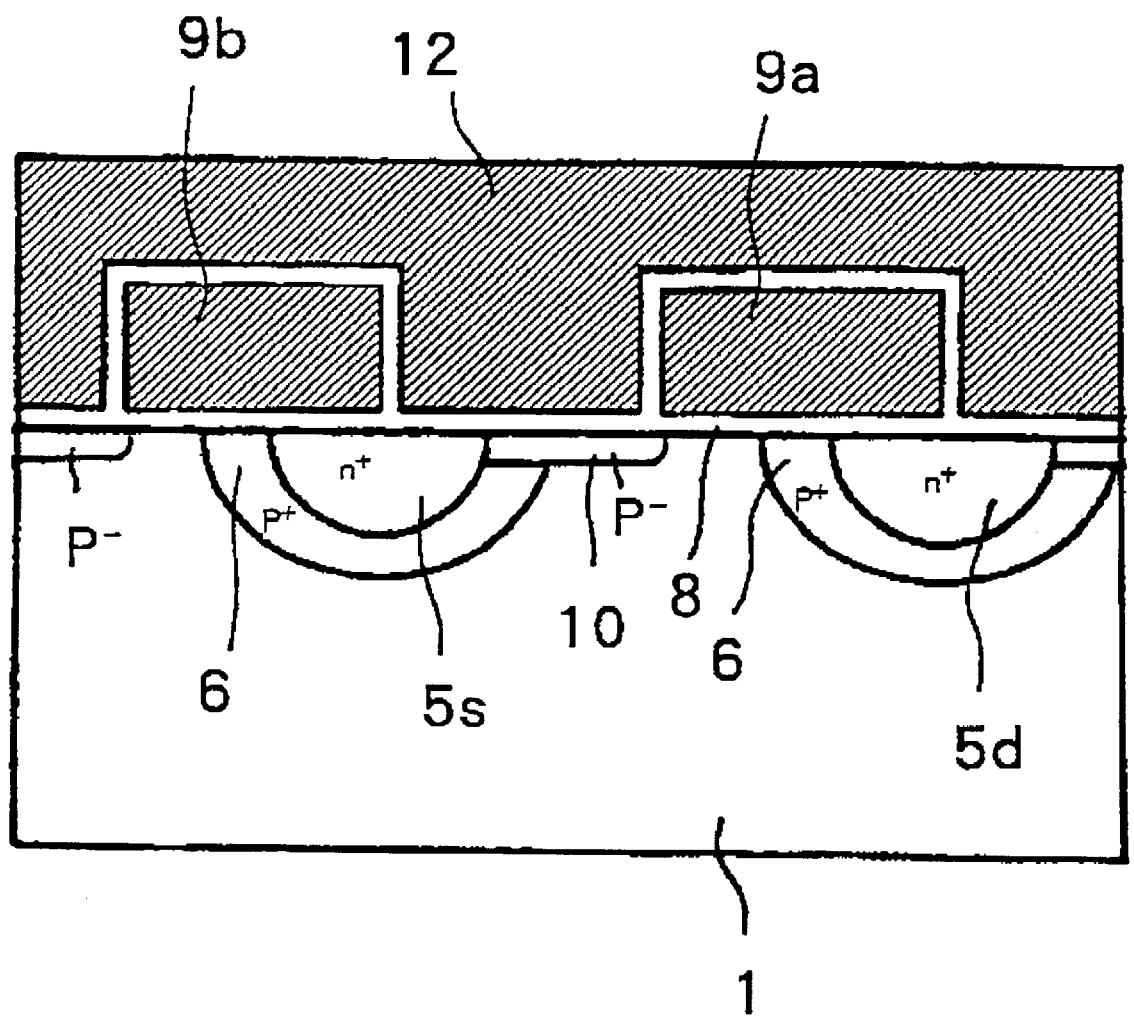
FIG. 6 is a fragmentary cross sectional elevation view illustrative of a novel flash memory taken along an A–A' line of FIG. 5.
Figure 7:
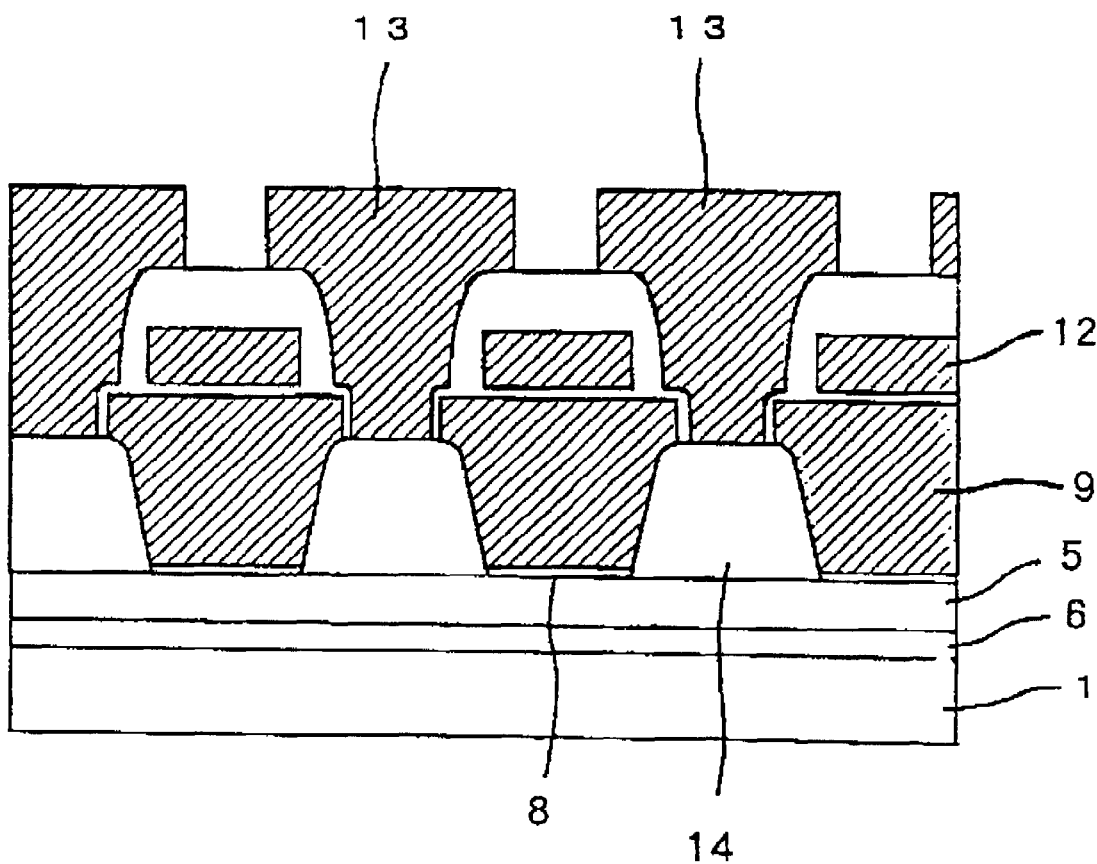
FIG. 7 is a fragmentary cross sectional elevation view illustrative of a novel flash memory taken along a B–B' line of FIG. 5.

A first embodiment according to the present invention will be described in detail with reference to the drawings. FIG. 5 is a fragmentary plane view illustrative of a novel flash memory of a first embodiment in accordance with the present invention. FIG. 6 is a fragmentary cross sectional elevation view illustrative of a novel flash memory taken along an A–A' line of FIG. 5. FIG. 7 is a fragmentary cross sectional elevation view illustrative of a novel flash memory taken along a B–B' line of FIG. 5. N-type impurity diffusion layers 5d and 5s are provided which extend over a surface of a p-type semiconductor substrate 1 in a first direction. The n-type impurity diffusion layers 5d and 5s are stripe-shaped. The n-type impurity diffusion layers 5d and 5s are used as a bit line and a source line respectively. Parts of the n-type impurity diffusion layers 5d and 5s are used as a drain and a source. The structure is a contact-less structure, wherein the bit line is used as both the source and drain, for which reason this structure is so called to as a virtual ground array structure.

In FIG. 6, if a left floating gate 9b is selected, then the impurity diffusion layer 5s serves as a drain and a bit line. An impurity diffusion layer not illustrated and positioned in left side of the left floating gate 9b serves as a source and a ground line or source line. The floating gate 9a is not selected and thus the impurity diffusion layer 5d has a ground potential. A floating gate 9 is provided on a gate insulation film 8 over a drain side half region of the channel region defined between the impurity diffusion layers 5s and 5d. A control gate 12 is provided on an insulator over the floating gates 9. The channel region not covered by the floating gates are overlaid by the insulator over which the control gate 12 also extends, so as to allow the control gate 12 to control the channel region. This structure is so called to as a split gate structure.

In accordance with the present invention, high impurity p+-type regions 6 are provided adjacent to the drain side impurity diffusion layer 5d in the channel region under the floating gate. The high impurity p+-type regions 6 has a high impurity concentration, for which reason a channel resistance in this region is high. The high impurity p+-type regions 6 are selectively formed only adjacent to the drain so that a field concentration is caused adjacent to the drain, whereby a highly efficient hot electron injection is obtained and an efficient data write operation is improved.

It is sufficient that the high impurity p+-type region 6 extends in an adjacent channel region to the drain region 5d. However, it is preferable for the fabrication process that the high impurity p+-type region 6 surrounds the drain region 5d. The high impurity p+-type regions 6 extend along the impurity diffusion regions 5 and in the first direction.

A low impurity concentration p-type region 10 is provided in the channel region but only a part not covered by the floating gate. Since the low impurity concentration p-type region 10 has a low impurity concentration, the low impurity concentration p-type region 10 reduces a channel resistance. As described above, the high impurity p+-type region 6 surrounds the drain region 5d. The low impurity concentration p-type region 10 prevents the high impurity p+-type region 6 from reaching the channel region.

The low impurity concentration p-type region 10 allows a better structure that the high impurity p+-type region 6 surrounds the drain region 5d. It is sufficient that the low impurity concentration p-type region 10 extends in the channel region only.

FIG. 7 is a fragmentary cross sectional elevation view illustrative of a novel flash memory taken along a B–B' line of FIG. 5. Field oxide films 14 are provided over a surface of the semiconductor substrate 1. Strip-shaped erasing gates 13 are provided over the field oxide films 14, so that the stripe-shaped erasing gates 13 extend in parallel to each other. Data erasing operation is carried out by drawing electrons from the top corner of the floating gate 9.

It is preferable that the silicon substrate is used as the semiconductor substrate 1. Memory cells are formed either in the semiconductor substrate or in p-type or n-type well region in the semiconductor substrate.

It is also preferable that the floating gate and the control gate comprise polysilicon.

Arsenic or antimony are preferable as being short diffusion distance.

There is no limit to methods of drawing electrons from the floating gate of the present flash memory.

FIGS. 8A through 8G are fragmentary cross sectional elevation views illustrative of a novel method of fabricating a novel flash memory shown in FIGS. 5, 6 and 7.

Figure 8A:
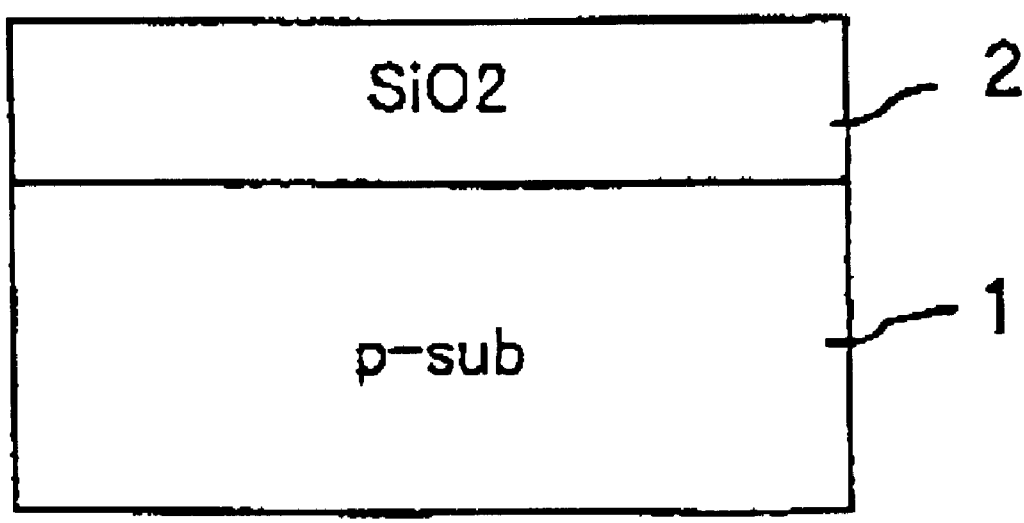
FIGS. 8A through 8G are fragmentary cross sectional elevation views illustrative of a novel method of fabricating a novel flash memory shown in FIGS. 5, 6 and 7.

With reference to FIG. 8A, field oxide regions not illustrated are formed on a p-type silicon substrate 1 before a silicon oxide layer 2 having a thickness of 300 nanometers is formed by a chemical vapor deposition method.

Figure 8B:
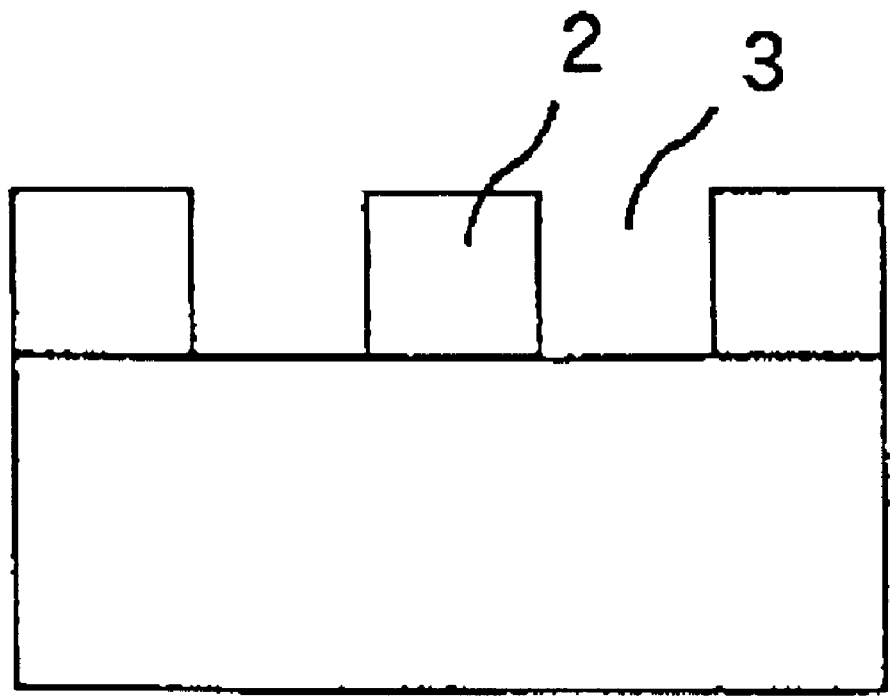

With reference to FIG. 8B, a photo-lithography method and a subsequent dry etching method are used to form stripe-shaped openings 3 in the silicon oxide layer 22, so that centers of the stripe-shaped openings 3 are aligned corresponding to centers of impurity diffusion layers serving as bit and source lines. An opening width may be set in the range of 0.18–0.5 micrometers and usually at 0.48 micrometers.

Figure 8C:
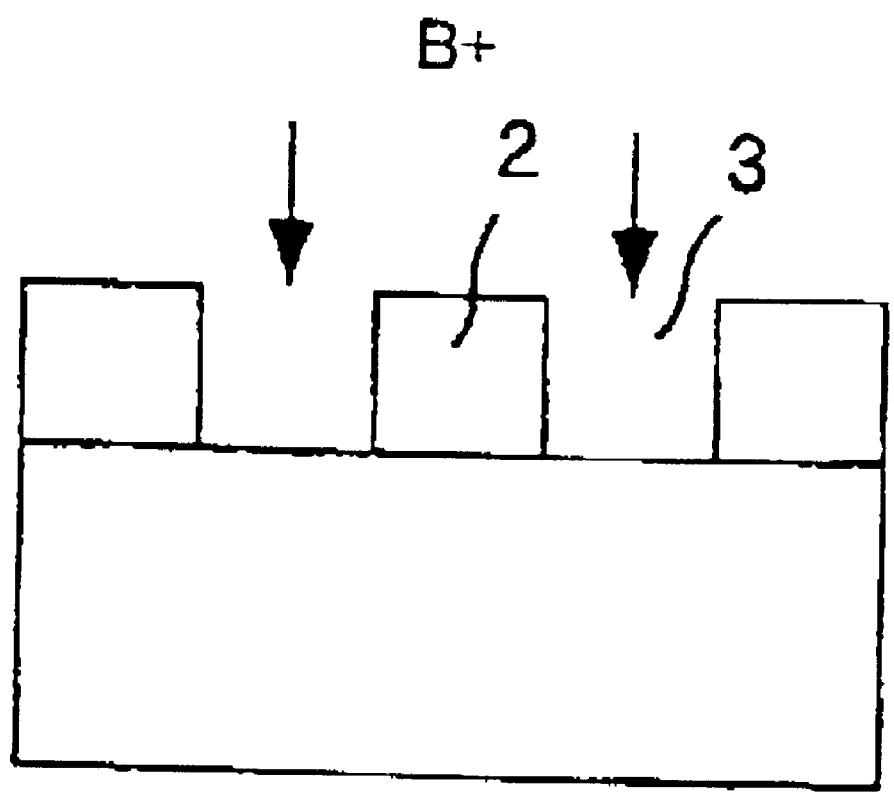

With reference to FIG. 8C, an ion-implantation of boron is carried out at an acceleration energy of 50 keV and a dose of 3E13 cm$^{-2}$.

Figure 8D:
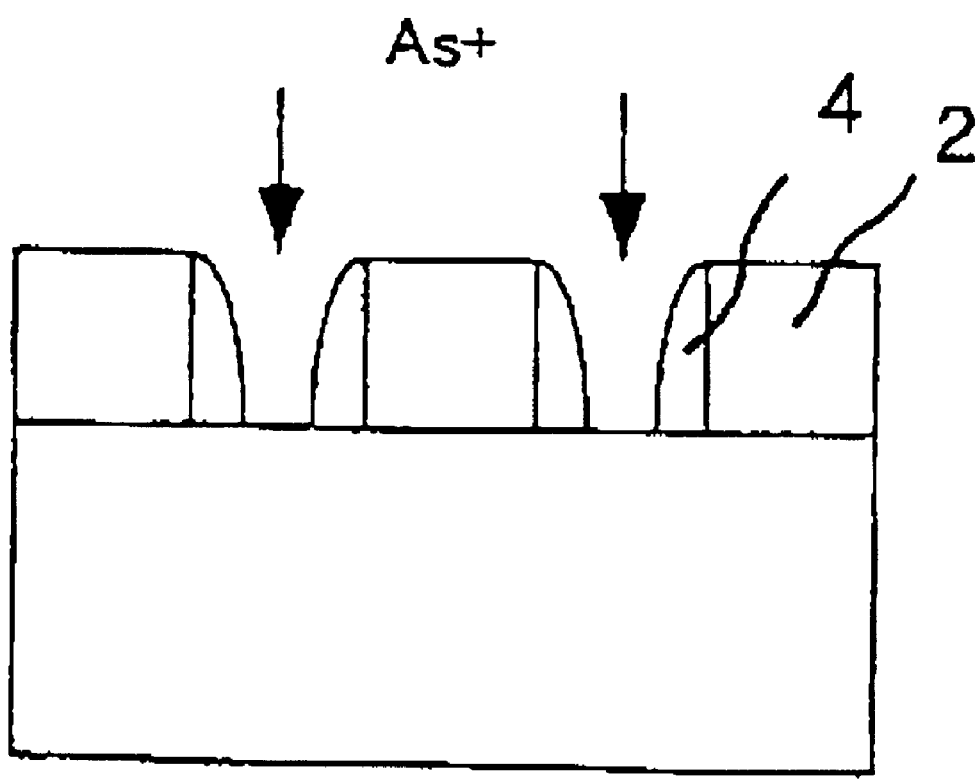

With reference to FIG. 8D, a silicon oxide film is deposited by a chemical vapor deposition for subsequent etch-back process to form side wall oxide films 4 on vertical walls of the stripe-shaped openings 3. An opening width may be set in the range of 0.1–0.2 micrometers and usually at 0.4 micrometers. The silicon oxide layer 2 and the side wall oxide films 4 are used as a mask to carry out an ion-implantation of arsenic at an acceleration energy of 40 keV and a dose of 4E15 cm$^{-2}$. The side wall oxide films 4 allow further size down the wide of the stripe-shaped openings beyond the limitation of the photo-lithography technique.

Figure 8E:
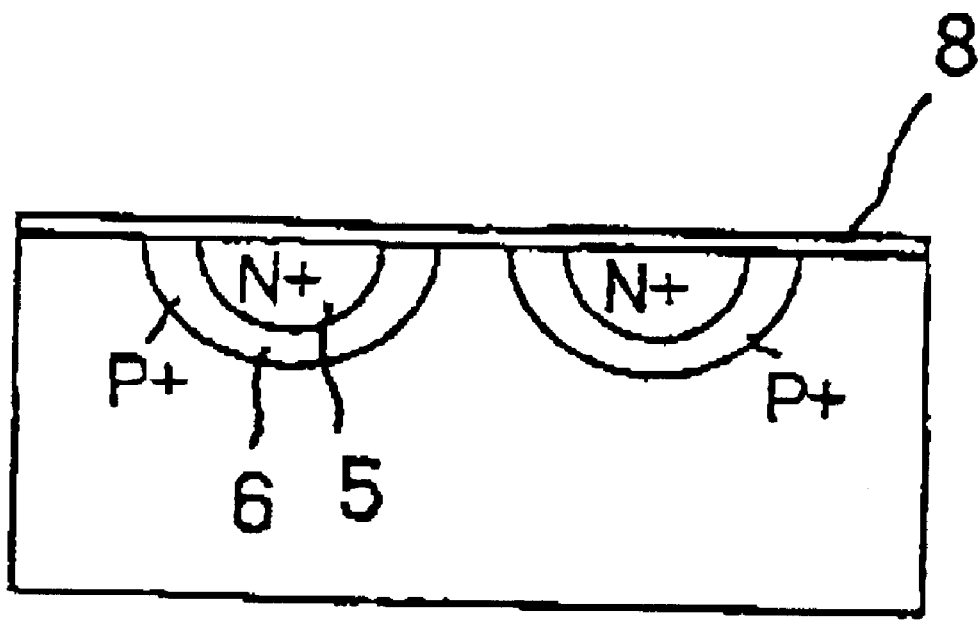

With reference to FIG. 8E, an anneal is carried out in a nitrogen atmosphere at a temperature of 950° C. for 20 minutes for activation of the arsenic ions to form impurity diffusion layers 5 and 6. Thereafter, the silicon oxide film 22 and the side wall oxide films 24 are removed, and then a gate oxide film 8 is formed.

Figure 8F:
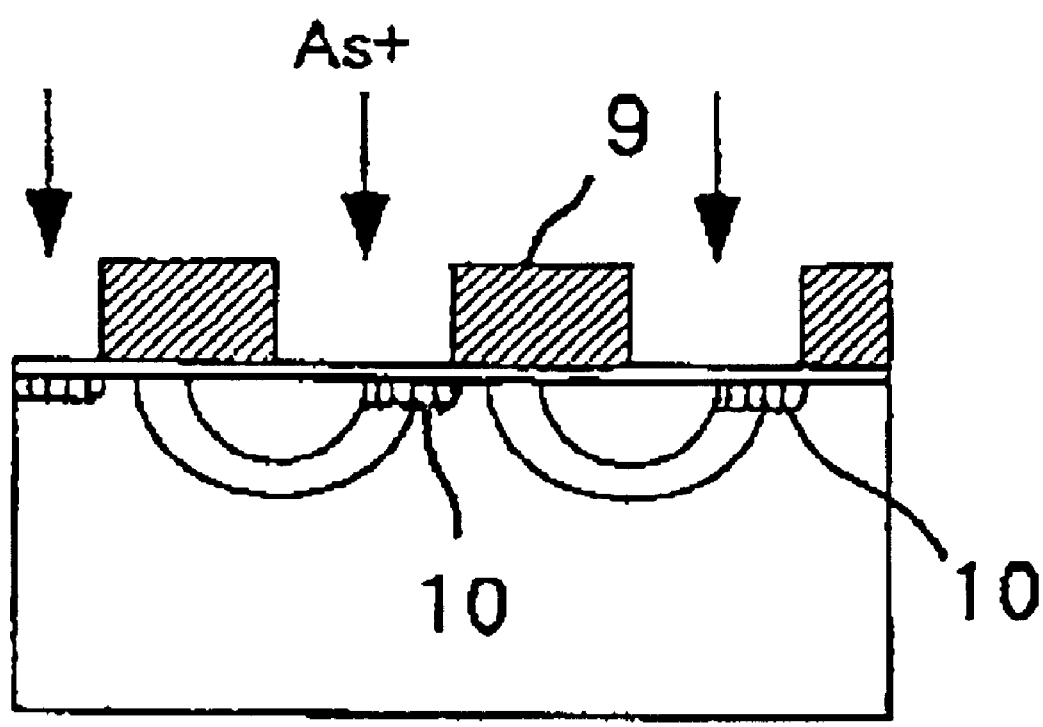

With reference to FIG. 8F, a silicon layer is deposited by a chemical vapor deposition method which has a thickness of 250 nanometers. Thereafter the silicon layer is patterned to form floating gates 9. Those floating gates 9 are used as masks for carrying out an ion-implantation of arsenic at an acceleration energy of 100 keV and a dose of 4E13 cm$^{-2}$.

Figure 8G:
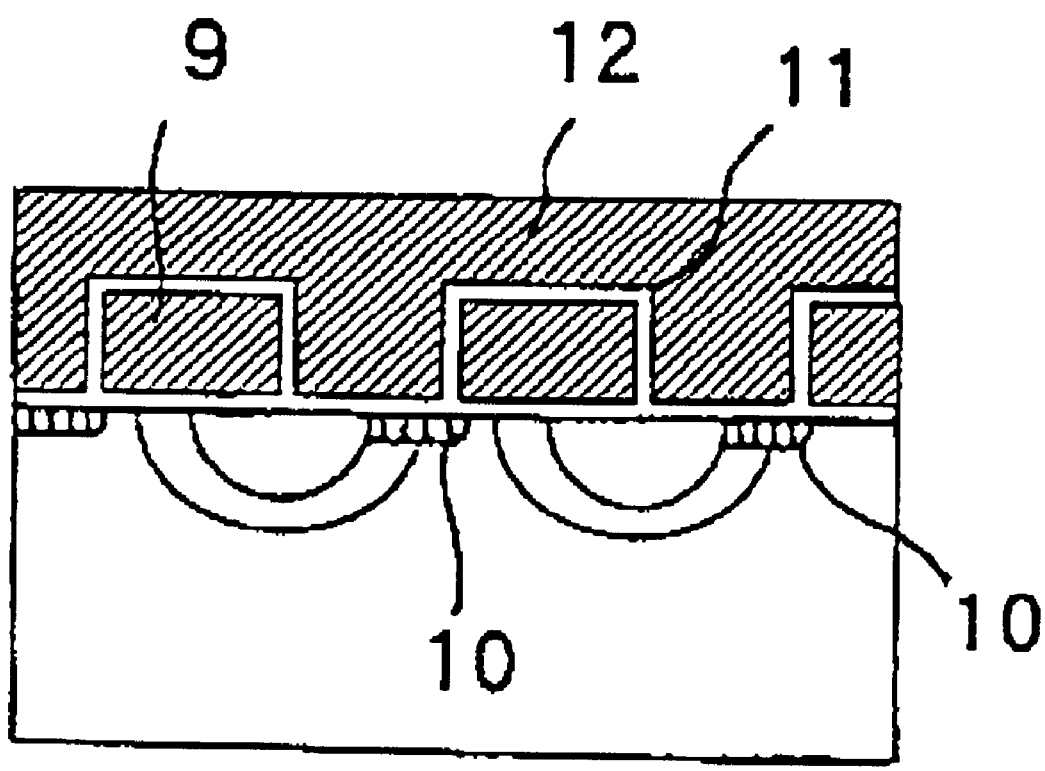

With reference to FIG. 8G, an inter-layer insulator 1 is formed on the floating gate and then a polysilicon film having a thickness of 250 nanometers is deposited before patterning the same to form a control gate 12. Further, an erasing gate 13 is formed to complete the another conventional flash memory.

In accordance with the above novel fabrication method, boron ion-implantation is carried out in an intermediate step of the mask formation for arsenic ion-implantation to form the impurity diffusion layers in the it line and the source line. Since the openings are provided on the bit line region and the source line region only, it is unnecessary to cover the other regions than the memory cells by photo-resist when the boron ion-implantation is carried out. The photo-resist process can be omitted to improve the productivity.

It is possible that a thick silicon oxide film as described in the prior art may be formed on surfaces of the impurity diffusion layers. It is also possible to form the field oxide films 14 in an adequate process.

Figure 9:
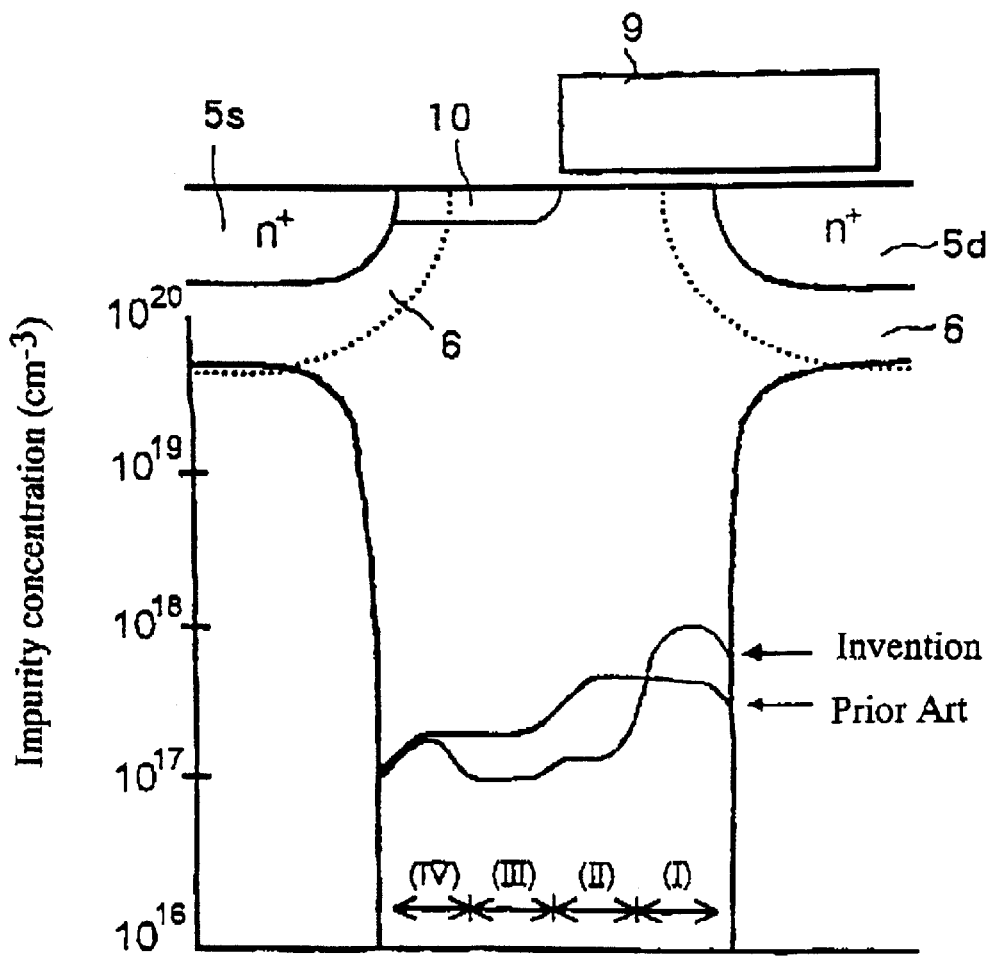
FIG. 9 is a diagram illustrative of variations in impurity concentration and field intensity over position in a channel length direction of the novel and conventional flash memory devices.
Figure 9:
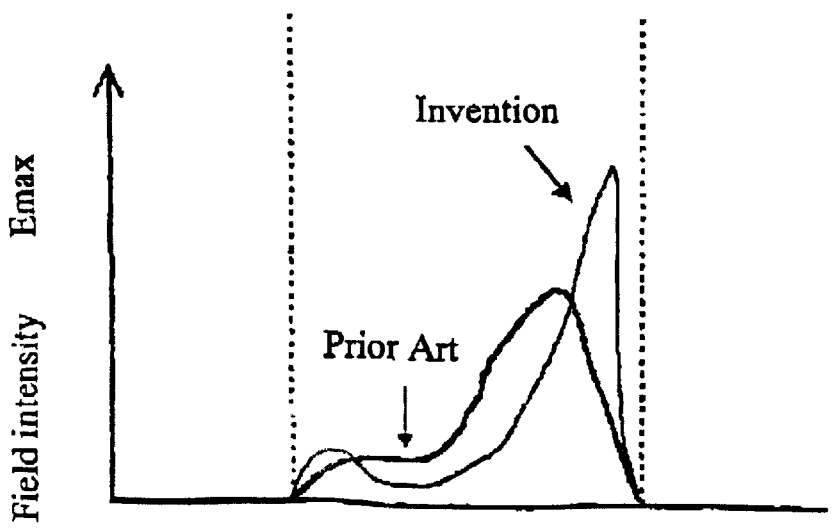

FIG. 9 is a diagram illustrative of variations in impurity concentration and field intensity over position in a channel length direction of the novel and conventional flash memory devices. The impurity concentration is represented to be an effective impurity concentration defined between p-type and n-type impurity concentrations. In this example, the channel region is p-type. The level of the p-type impurity concentration of the channel region corresponds to the resistance of the channel region. In view of the impurity concentration profile of the present invention, the channel region is considered to be divided into four regions (I), (II), (III), (IV). In the first and second regions (I), and (II), the impurity concentration is not constant. The impurity concentration of the first region (I) is higher than the impurity concentration of the second region (II). The first region (I) corresponds to the p+-type high impurity concentration region 6. A flat portion of the second region (II) corresponds to the background impurity concentration. Depending upon condition, no flat portion may exist, but the second region (II) has the same impurity concentration as the substrate. Under the floating gate, the impurity concentration is simply decreased from the peak point in the first region (I) toward the source side.

The third and fourth regions (III) and (IV) are not covered by the floating gate and thus correspond to the p-type low impurity concentration region 10. The fourth region (IV) adjacent to the source has a higher impurity concentration than the third region (III). It is possible to reduce the impurity concentration of the fourth region (IV) but so as not to increase the resistance of the channel region. In this example, arsenic ion-implantation is carried out to reduce the n-type impurity concentration as the conventional one, but further reduction is also possible. In the third region (III), the n-type impurity concentration is sufficiently reduced.

By contrast to the novel structure, in accordance with the conventional structure, the first and second regions (I) and (II) under the floating gate have the constant boron impurity concentration. On the other hand, the part not covered by the floating gate has reduced in p-type impurity concentration by the arsenic ion-implantation.

The novel structure of the present invention has a sharp-pointed peak of the field distribution between the source and drain. The peak is adjacent to the drain and this the field concentration appears near the drain, whereby the efficient hot electron injection can be obtained.

The highly efficient hot electron injection allows a reduction in resistance of the channel region only by reducing a resistance of a part of the channel region. If the impurity concentration peak of the first region is made correspond to the conventional one, the impurity concentrations of the second, third and fourth regions (II), (III) and (IV) are further reduced, whereby not only the high field concentration but also the reduction in resistance of the channel region can be obtained.

Further, the reduction in resistance of the channel region causes a larger drain current under the same source-drain voltage application, for which reason it is possible to reduce the time necessary for discharging the pre-charged bit lines by the memory cell, whereby a read out speed is increased. Furthermore, a difference in read out current between a memory cell storing "1" and a memory cell storing "0" is made larger, whereby in the memory device storing multiple values, an allowable range in reading out current responsive to individual value is made wider, whereby an accurate reading out operation and no leakage of charge accumulated in the floating gate may be caused, resulting in increase in reliability of the memory device.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A structure of a channel region of a first conductivity type between source and drain diffusion regions of a second conductivity type, parts of said drain region and of said channel region underlying a floating gate electrode, said channel region comprising:

a first channel sub-region being directly adjacent to said drain region, said first channel sub-region being under said floating gate electrode, and said first channel sub-region having a first impurity concentration range;

a second channel sub-region being directly adjacent to said first channel sub-region, so that said first channel sub-region is disposed between said drain region and said second channel sub-region, said second channel sub-region being under said floating gate electrode, and said second channel sub-region having a second impurity concentration range which is lower than said first impurity concentration range; and a third channel sub-region being directly adjacent to said second channel sub-region, so that said second channel sub-region is between said first and third channel sub-regions, said third channel sub-region being closer to said source region than said second channel sub-region, a boundary between said second and third channel sub-regions being substantially aligned to an edge of said floating gate electrode, and said third channel sub-region having a third impurity concentration range which is lower than said second impurity concentration range.

2. The structure as claimed in claim 1, wherein said first channel sub-region has a sharp peak of an impurity concentration profile of said channel region structure.

3. A non-volatile semiconductor memory device comprising:

a semiconductor substrate of a first conductivity type;

source and drain regions of a second conductivity type being selectively formed in said semiconductor substrate;

a channel region of the first conductivity type being disposed between said source and drain regions; and a floating gate electrode overlying parts of said drain region and of said channel region, wherein said channel region further comprises:

a first channel sub-region being directly adjacent to said drain region, said first channel sub-region being under said floating gate electrode, and said first channel sub-region having a first impurity concentration range;

a second channel sub-region being adjacent directly to said first channel sub-region, so that said first channel sub-region is between said drain region and said second channel sub-region, said second channel sub-region being under said floating gate electrode, said second channel sub-region comprising a part of said semiconductor substrate, and said second channel sub-region having a second impurity concentration range which is lower than said first impurity concentration range; and a third channel sub-region being directly adjacent to said second channel sub-region, so that said second channel sub-region is between said first and third channel sub-regions, said third channel sub-region being closer to said source region than said second channel sub-region, a boundary between said second and third channel sub-regions being substantially aligned to an edge of said floating gate electrode, and said third channel sub-region having a third impurity concentration range which is lower than said second impurity concentration range.

4. The device as claimed in claim 3, wherein said first channel sub-region has a sharp peak of an impurity concentration profile of said channel region structure.

* * * * *